United States Patent
Lu et al.

(10) Patent No.: US 11,302,773 B2
(45) Date of Patent: Apr. 12, 2022

(54) BACK-END-OF-LINE INTEGRATED METAL-INSULATOR-METAL CAPACITOR

(71) Applicant: QUALCOMM Incorporated, San Diego, CA (US)

(72) Inventors: Ye Lu, San Diego, CA (US); Junjing Bao, San Diego, CA (US); Haitao Cheng, San Jose, CA (US); Chao Song, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 172 days.

(21) Appl. No.: 16/155,694

(22) Filed: Oct. 9, 2018

(65) Prior Publication Data

US 2020/0111865 A1 Apr. 9, 2020

(51) Int. Cl.
*H01L 49/02* (2006.01)
*H01L 23/522* (2006.01)
*H01L 23/532* (2006.01)

(52) U.S. Cl.
CPC .......... *H01L 28/60* (2013.01); *H01L 23/5223* (2013.01); *H01L 28/65* (2013.01); *H01L 23/53209* (2013.01); *H01L 23/53228* (2013.01); *H01L 23/53242* (2013.01); *H01L 23/53257* (2013.01)

(58) Field of Classification Search
CPC ..... H01L 28/60; H01L 28/65; H01L 23/5223; H01L 23/53209; H01L 23/53228; H01L 23/53242; H01L 23/53257
See application file for complete search history.

(56) References Cited

U.S. PATENT DOCUMENTS

| | | | |
|---|---|---|---|
| 8,847,354 B2 | 9/2014 | Abou-Khalil et al. | |
| 9,041,148 B2 * | 5/2015 | Jakushokas | H01G 4/002 |
| | | | 257/516 |
| 9,252,104 B2 | 2/2016 | Zhu et al. | |
| 9,263,437 B2 * | 2/2016 | Liang | H01L 23/5223 |
| 9,837,354 B2 | 12/2017 | Liu et al. | |
| 9,893,144 B1 | 2/2018 | Yang | |
| 2003/0027385 A1 | 2/2003 | Park et al. | |
| 2006/0252218 A1 | 11/2006 | Abdul-Ridha et al. | |
| 2007/0034988 A1 * | 2/2007 | Won | H01L 23/5223 |
| | | | 257/532 |
| 2014/0367757 A1 * | 12/2014 | Jakushokas | H01G 4/33 |
| | | | 257/306 |
| 2015/0171207 A1 * | 6/2015 | Liang | H01L 27/0688 |
| | | | 257/296 |
| 2018/0122892 A1 | 5/2018 | Bergendahl et al. | |

OTHER PUBLICATIONS

International Search Report and Written Opinion—PCT/US2019/047369—ISA/EPO—dated Oct. 30, 2019.

* cited by examiner

*Primary Examiner* — Lex H Malsawma
(74) *Attorney, Agent, or Firm* — Qualcomm Incorporated

(57) ABSTRACT

A low cost capacitor (e.g., metal-insulator-metal (MIM) capacitor) is included in the back-end-of-line layers for effective routing and area savings. The capacitor has a first electrode (e.g., a first terminal of the capacitor) including a conductive back-end-of-line (BEOL) layer and a second electrode (e.g., a second terminal of the capacitor) including a nitride-based metal. The capacitor also has an etch stop layer (e.g., a dielectric of the capacitor) between the first electrode and the second electrode.

20 Claims, 10 Drawing Sheets

US 11,302,773 B2

BACK-END-OF-LINE INTEGRATED METAL-INSULATOR-METAL CAPACITOR

TECHNICAL FIELD

The present disclosure relates generally to semiconductor devices and, more particularly, to back-end-of-line integrated metal-insulator-metal (MIM) capacitors.

BACKGROUND

Mobile radio frequency (RF) chips (e.g., mobile RF transceivers) have migrated to a deep sub-micron process node due to cost and power consumption considerations. Designing mobile RF transceivers is further complicated by added circuit functions for supporting communication enhancements, such as 5G communications. Further design challenges for mobile RF transceivers include using passive devices, which directly affect analog/RF performance considerations, including mismatch, noise, and other performance considerations.

Analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures.

In one configuration, MIM capacitors include a number of horizontal parallel plates of metal stacked into several layers, separated by dielectrics. The plates are conductive and alternately coupled to form opposite electrodes of a capacitor. The vertical stack of plates is simple to construct, and offers more capacitance per unit area than two conductive surfaces alone. However, while simple to construct, forming a MIM capacitor with many layers requires additional processing steps, which can add prohibitive cost to the manufacturing process.

SUMMARY

A capacitor includes a first electrode and a second electrode. The first electrode includes a conductive back-end-of-line layer. The second electrode includes a nitride based metal. The capacitor also includes an etch stop layer between the first electrode and the second electrode.

A method of fabricating a capacitor includes forming a first electrode including a conductive back-end-of-line (BEOL) layer. The method may also include depositing an etch stop layer on the first electrode. The method further includes fabricating a second electrode, including a nitride based metal, on the etch stop layer.

A capacitor includes means for interconnecting fabricated devices and wiring interconnects on a substrate. The capacitor also includes an electrode. The electrode includes a nitride based metal. The capacitor also includes an etch stop layer between the interconnecting means and the electrode.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
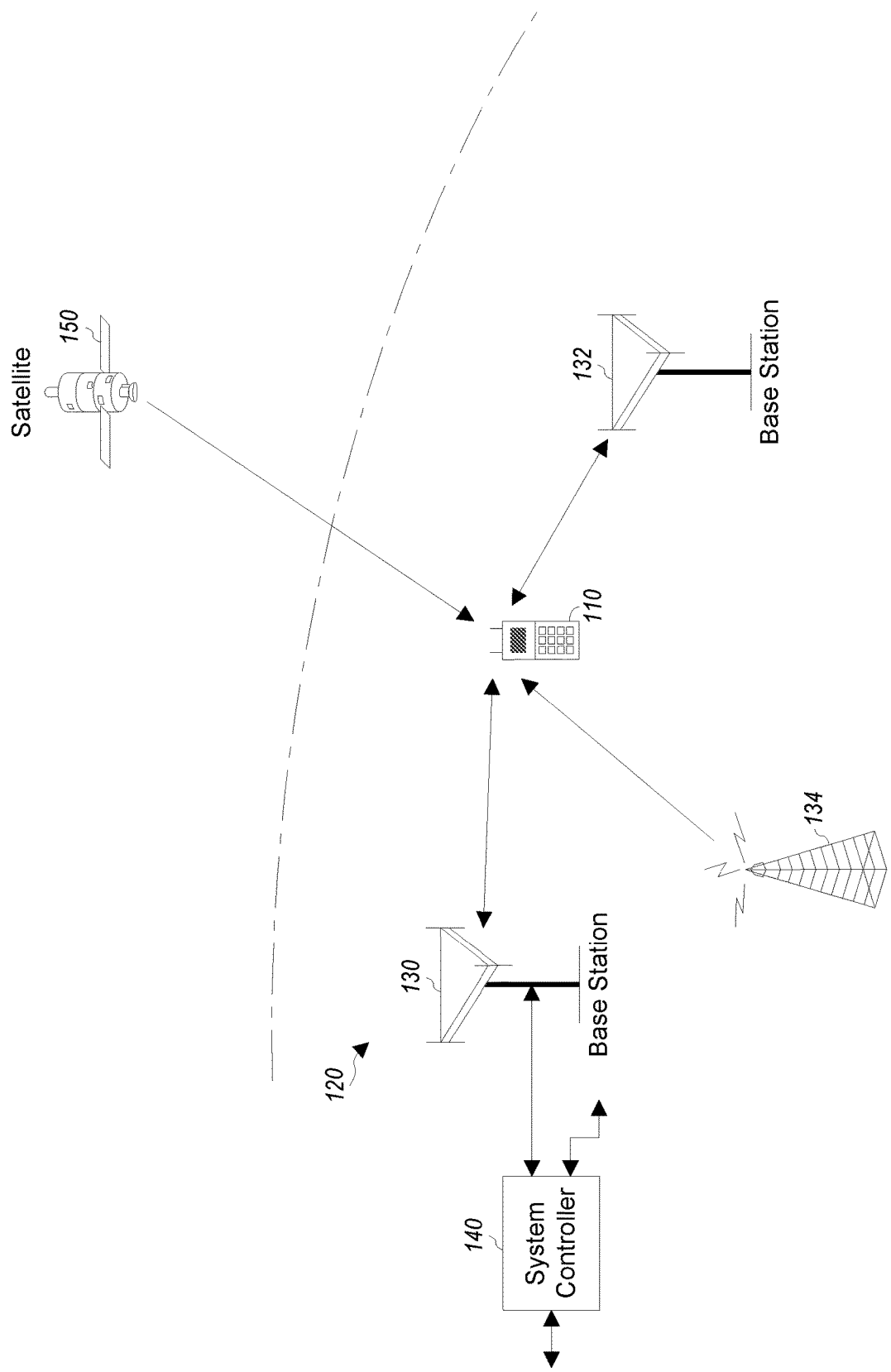
FIG. 1 shows a wireless device communicating with a wireless system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

It is desirable to provide capacitors with high capacitance and a small footprint (e.g. unit area capacitance) for analog designs such as analog-to-digital converters (ADC), phase lock loops (PLLs), etc. The process flow for fabrication of the capacitor may include front-end-of-line (FEOL) processes, middle-of-line (MOL) processes, and back-end-of-line (BEOL) processes. The back-end-of-line interconnect layers may refer to the conductive interconnect layers (e.g., a first interconnect layer or metal one (M1), metal two (M2), metal three (M3), metal four (M4), etc.) for electrically coupling to front-end-of-line active devices of an integrated circuit. The various back-end-of-line interconnect layers are formed at corresponding back-end-of-line interconnect levels, in which lower back-end-of-line interconnect levels use thinner metal layers relative to upper back-end-of-line interconnect levels. The back-end-of-line interconnect layers may electrically couple to middle-of-line interconnect layers, for example, connecting the M1 layer to an oxide diffusion (OD) layer of an integrated circuit.

The middle-of-line interconnect layer may include a zero interconnect layer (M0) for connecting the M1 layer to an active device layer of an integrated circuit. A back-end-of-line first via (V2) may connect the M2 layer to the M3 layer or others of the back-end-of-line interconnect layers. It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

A metal-insulator-metal (MIM) capacitor in the back-end-of-line (BEOL) layers has been proposed to overcome the challenge of obtaining high density capacitance. The MIM capacitor uses vertical plate-to-plate coupling. These MIM capacitors are generally formed between the upper conductive interconnect layers (e.g., M9 and M10) of an interconnect stack. For example, these MIM capacitors are built in high level oxide modules (e.g., the top two back-end-of-line layers) and use a high-k material as an insulator. This solution, however, involves additional masks as well as a high-K (HiK) oxide deposition process to achieve an increased capacitor density. As a result, these MIM capacitors are costly because at least two extra masks are used to form the capacitors, and the high-K material for the insulator is expensive.

Aspects of the present disclosure are directed to a low cost capacitor (e.g., metal-insulator-metal (MIM) capacitor) included in the back-end-of-line layers for effective routing and area savings. The capacitor has a first electrode (e.g., a first terminal of the capacitor) including a conductive back-end-of-line (BEOL) layer and a second electrode (e.g., a second terminal of the capacitor) including a nitride-based metal. The capacitor also has an etch stop layer (e.g., a dielectric of the capacitor) between the first electrode and the second electrode.

MIM capacitors fabricated according to aspects of the present disclosure are less costly relative to conventional capacitors. For example, these MIM capacitors do not use an extra mask and do not use a separate expensive high-k dielectric. Moreover, these MIM capacitors can be fabricated at every BEOL level for effective routing and area savings.

FIG. 1 shows a wireless device 110 communicating with a wireless communications system 120, according to aspects of the present disclosure. The wireless device may include the low cost MIM capacitor, according to aspects of the present disclosure. The wireless communications system 120 may be a fifth generation (5G) system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communications system 120 including two base stations 130 and 132 and one system controller 140. In general, a wireless system may include any number of base stations and any number of network entities.

A wireless device 110 may also be referred to as a user equipment (UE). The user equipment may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. For example, the wireless device 110 may support Bluetooth low energy (BLE)/BT (Bluetooth) with a low energy/high efficiency power amplifier having a small form factor of a low cost.

The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G, LTE, CDMA2000, WCDMA, TD-SCDMA, GSM, 802.11, BLE/BT, etc. The wireless device 110 may also support carrier aggregation, which is operation on multiple carriers.

Figure 2:
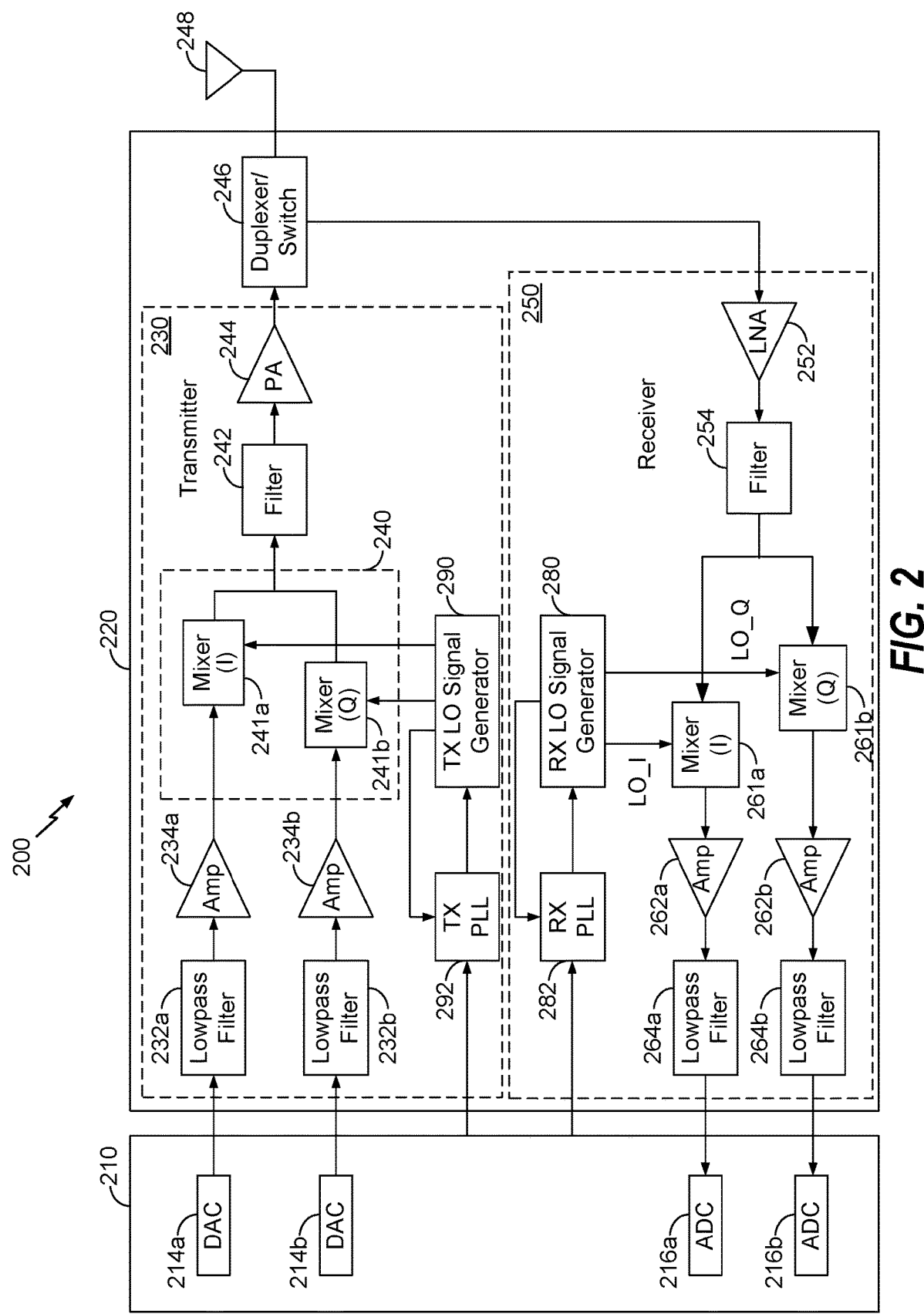
FIG. 2 shows a block diagram of the wireless device in FIG. 1.

FIG. 2 shows a block diagram of an exemplary design of a wireless device 200, such as the wireless device 110 shown in FIG. 1, including a low cost MIM capacitor, according to aspects of the present disclosure. FIG. 2 shows an example of a mobile RF transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 1. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally includes the mobile RF transceiver 220 and a data processor 210. The data processor 210 may include a memory (not shown) to store data and program codes, and may generally include analog and digital processing elements. The mobile RF transceiver 220 may include the transmitter 230 and receiver 250 that support bi-directional communication. In general, the wireless device 200 may include any number of transmitters and/or receivers for any number of communications systems and frequency bands. All or a portion of the mobile RF transceiver 220 may be implemented on one or more analog integrated circuits (ICs), radio frequency (RF) integrated circuits (RFICs), mixed-signal ICs, and the like.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog-converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to remove undesired images caused by the prior digital-to-analog conversion. Amplifiers 234a and 234b (Amp) amplify the signals from lowpass filters 232a and 232b, respectively, and provide in-phase (I) and quadrature (Q) baseband signals. Upconverters 240 include an in-phase upconverter 241a and a quadrature upconverter 241b that upconverter the in-phase (I) and quadrature (Q) baseband signals with in-phase (I) and quadrature (Q) transmit (TX) local oscillator (LO) signals from a TX LO signal generator 290 to provide upconverted signals. A filter 242 filters the upconverted signals to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248. The duplexer/switch 246, however, introduces significant insertion loss in a communication path. This follows because the duplexer is placed after the power amplifier 244 and in close proximity to the antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital-converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
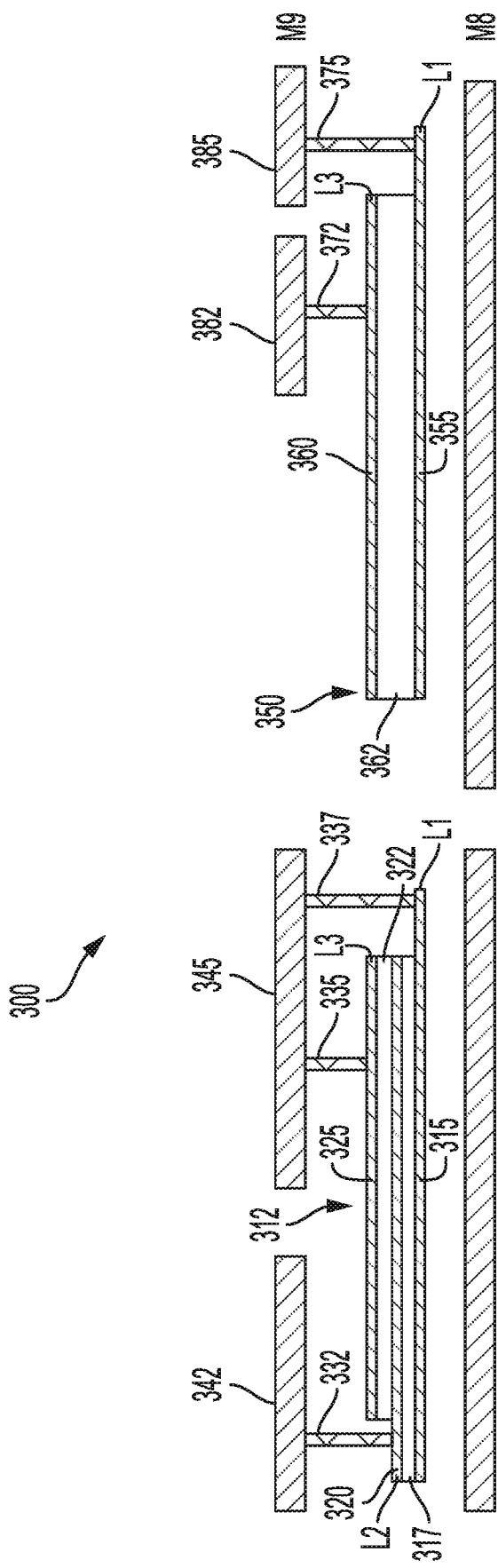
FIG. 3 shows a metal-insulator-metal (MIM) capacitor structure including a first capacitor and a second capacitor.

FIG. 3 shows a metal-insulator-metal (MIM) capacitor structure 300 including a first capacitor 312 and a second capacitor 350. For example, the first capacitor 312 may be a low-voltage capacitor and the second capacitor 350 may be a high-voltage capacitor on a same chip using three metal layers L1, L2, and L3, as discussed further below. Each metal layer may include titanium (Ti), titanium nitride (TiN), tantalum (Ta), tantalum nitride (TaN), copper (Cu), another type of metal, or any combination thereof. The first and third metal layers L1 and L3 are the bottom-most and top-most metal layers, respectively, of the three metal layers L1, L2, and L3, and the second metal layer L2 is the middle metal layer.

The first capacitor 312 includes a first electrode 315 formed from the first metal layer L1, a second electrode 320 formed form the second metal layer L2, and a third electrode 325 formed from the third metal layer L3. The first, second, and third electrodes 315, 320, and 325 may be formed by patterning the first, second, and third metal layers L1, L2, and L3 using masks (e.g., lithographic masks) that define the first, second, and third electrodes 315, 320, and 325. The first capacitor 312 also includes a first dielectric layer 317 between the first and second electrodes 315 and 320, and a second dielectric layer 322 between the second and third electrodes 320 and 325. The first and second dielectric layers 317 and 322 may have approximately the same thickness or different thicknesses. Each dielectric layer may include a single layer of dielectric material or multiple layers of different dielectric materials.

The second electrode 320 is coupled to a first power-supply rail 342 by via 332, and the first and third electrodes 315 and 325 are coupled to a second power-supply rail 345 by vias 337 and 335, respectively. It is to be appreciated that each electrode 315, 320, and 325 may be coupled to the corresponding power-supply rail by more than one via.

The second capacitor 350 is implemented using the first metal layer L1 (bottom-most metal layer) and the third metal layer L3 (top-most metal layer) without using the second metal layer L2 (middle metal layer). The second capacitor 350 includes a fourth electrode 355 formed from the first metal layer L1 and a fifth electrode 360 formed from the third metal layer L3. The fourth and fifth electrodes 355 and 360 may be formed by patterning the first and third metal layers L1 and L3 using masks (e.g., lithographic masks) that define the fourth and fifth electrodes 355 and 360.

The second capacitor 350 also includes a third dielectric layer 362 between the fourth and fifth electrodes 355 and 360. The fourth electrode 355 is coupled to a third power-supply rail 385 by via 375, and the fifth electrode 360 is coupled to a fourth power-supply rail 382 by via 372. The dielectric layers 317, 322, and 362 may include high-k dielectric materials such as, for example, hafnium-based high-k materials, tantalum-based high-k materials, or any combination thereof. The use of high-k materials for the dielectric layers increases capacitance density for a given dielectric thickness.

Figure 4:
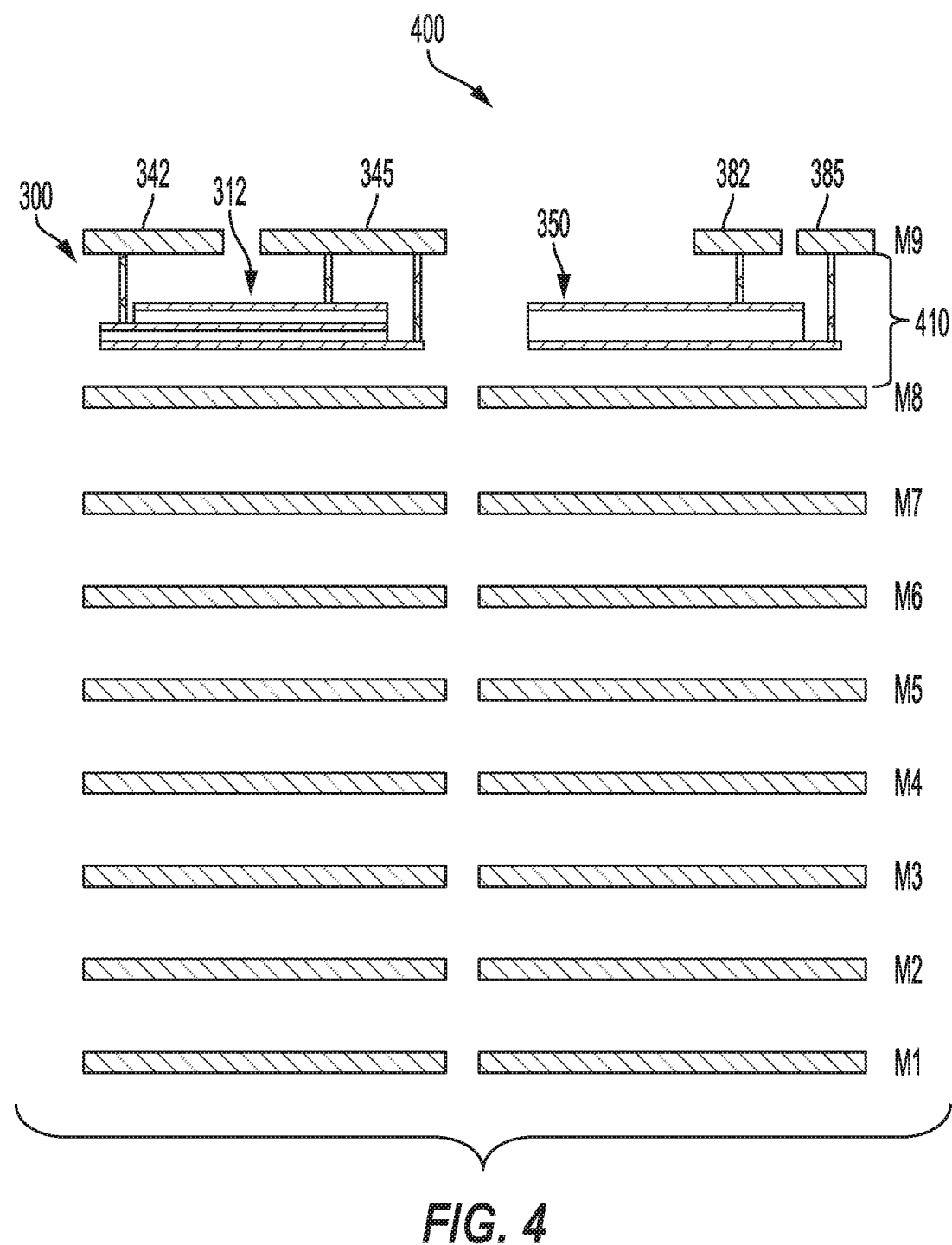
FIG. 4 shows a chip in which the MIM capacitor structure in FIG. 3 is fabricated.

FIG. 4 shows a chip 400 in which the MIM capacitor structure 300 in FIG. 3 is fabricated. For illustrative purposes, some of the labelling and numbering of the devices and features of FIG. 4 are similar to those of FIG. 3. The chip 400 includes at least nine interconnect metals M1 to M9 with insulators between the interconnect metals. M1 is the bottom-most interconnect metal and M9 is the upper-most interconnect metal shown in FIG. 3. The interconnect metals M1 to M9 may be used to interconnect various components of the chip 400. For ease of illustration, the structures (e.g., vias) interconnecting the interconnect metals M1 to M9 are not shown in FIG. 4.

In the example shown in FIG. 4, the MIM capacitor structure 300 is located between interconnect metals M8 and M9 of the chip 400. Power-supply rails 342, 345, 382, and 385 are formed out of the interconnect metal M9. The first capacitor 312 and the second capacitor 350 are formed within an insulator 410 (e.g., silicon oxide, silicon nitride, etc.) between interconnect metals M8 and M9.

Figure 5:
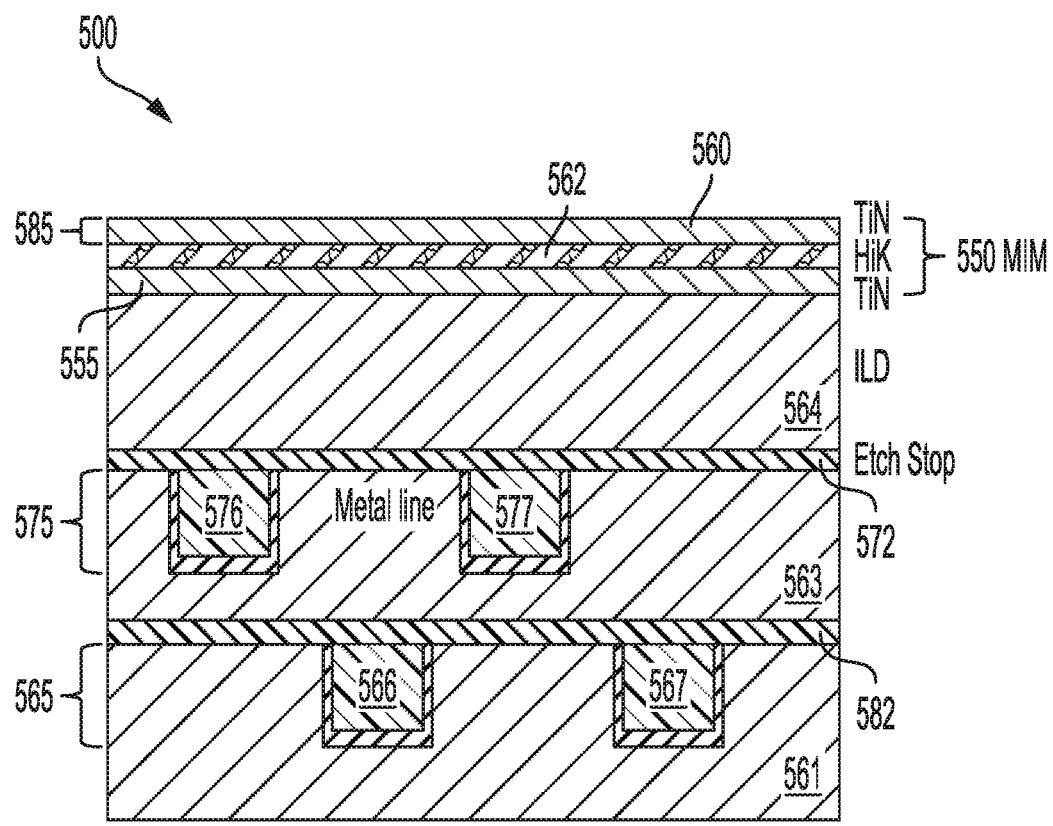
FIG. 5 illustrates a back-end-of-line capacitor structure.

FIG. 5 illustrates a back-end-of-line (BEOL) capacitor structure 500. The BEOL capacitor structure 500 include a first conductive interconnect layer 565, a second conductive interconnect layer 575, and a third conductive interconnect layer 585. For example, the first conductive interconnect layer 565 includes metal lines 566 and 567 within a first interlayer dielectric 561. The second conductive interconnect layer 575 includes metal lines 576 and 577 within a second interlayer dielectric 563. The conductive interconnect layers may be separated by etch stop layers. For example, the first conductive interconnect layer 565 may be separated from the second conductive interconnect layer 575 by a first etch stop 582. The second conductive interconnect layer 575 may be separated from the third conductive interconnect layer 585 (including the interlayer dielectric 564) by a second etch stop 572.

The BEOL capacitor structure 500 includes a metal-insulator-metal (MIM) capacitor 550 formed between an upper conductive interconnect layer (e.g., between the interconnect metal M8 and the interconnect metal M9, as shown in FIG. 4). In this aspect, however, a top conductive plate 560 or a bottom conductive plate 555 of the MIM capacitor 550 belongs to an upper conductive interconnect layer that is immediately below/above the top conductive plate 560/bottom conductive plate 555. For example, the top conductive plate 560 of the MIM capacitor 550 may be part of the third conductive interconnect layer 585 and the bottom conductive plate 555 is fabricated for the MIM capacitor structure. The MIM capacitor 550 includes a dielectric 562 (e.g., high-K (HiK) dielectric) between the top conductive plate 560 and the bottom conductive plate 555. The dielectric constant K value of the high-K dielectric may be around 16 (~16). The top conductive plate 560 or the bottom conductive plate 555 may be made of a conductive nitride (e.g., titanium nitride (TiN)).

The use of one of the upper interconnect layers as a plate of the MIM capacitor 550 enables a simplified fabrication process. Fabrication of the MIM capacitor 550 in this manner avoids an additional deposition and mask for fabricating one of the plates of the MIM capacitor 550. Thus, a MIM capacitor structure is formed as a single MIM capacitor plate and an adjacent upper interconnect layer, for example, as shown in FIG. 5. This MIM capacitor, however, is formed between the upper conductive interconnect layers (e.g., interconnect metal M9 and interconnect metal M10) of an interconnect stack.

MIM capacitors are useful as decoupling capacitors. Decoupling capacitors are commonly used in a chip to filter out noise on a power supply, in which the decoupling capacitors are coupled between two power-supply rails (e.g., Vdd and Vss) of the power supply. In advanced integrated circuit (IC) chips, the capacitance is specified to be as high as possible. Conventionally, the MIM capacitor is implemented on the top interconnect metals that correspond to top oxide layers because capacitance in lower layers is reduced. This follows because lower layer capacitors are specified for use in resistor-capacitor (RC) delay circuits, and only low-K material is used for the interlayer dielectric (e.g., the interlayer dielectric 561 and 563). Improved methods for fabricating MIM capacitors as well as improved structures of MIM capacitors in the lower layers are therefore desirable.

Figure 6:
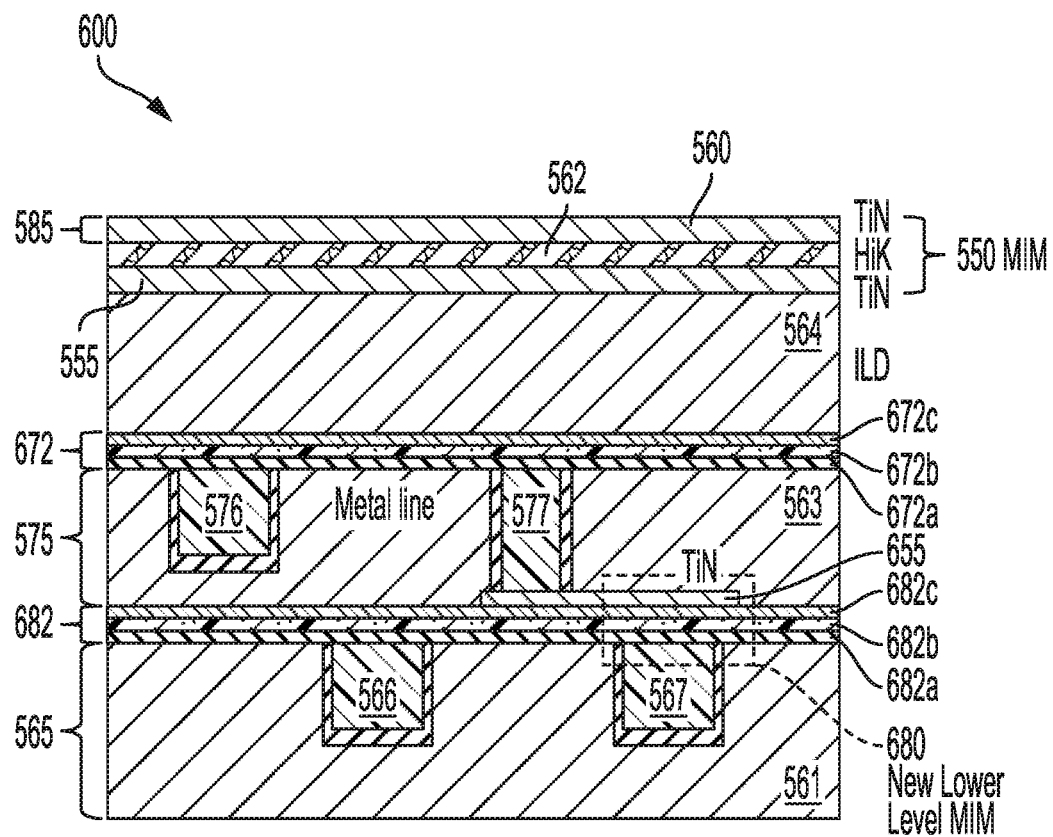
FIG. 6 illustrates a back-end-of-line capacitor structure including a lower level metal-insulator-metal (MIM) capacitor, according to aspects of the present disclosure.

FIG. 6 illustrates a back-end-of-line capacitor structure 600 including a lower level MIM capacitor 680, according to aspects of the present disclosure. For illustrative purposes, some of the labelling and numbering of the devices and features of FIG. 6 are similar to those of FIG. 5.

In one aspect, the lower level MIM capacitor 680 is implemented in one or more of the first four layers of the back-end-of-line (BEOL) layers. The lower level MIM capacitor 680 incorporates etch stop layers on lower BEOL layers (e.g., first conductive interconnect layer 565 and second conductive interconnect layer 575). These etch stop layers used in some fabrication techniques (e.g., seven nanometer (nm) implementations) include multiple layers. For example, the back-end-of-line capacitor structure 600 may include a first etch stop layer 672 that includes a first etch stop portion 672a, a second etch stop portion 672b, and a third etch stop portion 672c. The back-end-of-line capacitor structure 600 also includes a second etch stop layer 682 that includes a fourth etch stop portion 682a, a fifth etch stop portion 682b, and a sixth etch stop portion 682c.

Each of the first etch stop portion 672a, the second etch stop portion 672b, and the third etch stop portion 672c is a different material. For example the first etch stop portion 672a includes a nitride of aluminum (AlN), the second etch stop portion 672b includes an oxygen doped carbon (ODC), and the third etch stop portion 672c includes aluminum monocarbonyl (AlOC) or an oxide of aluminum (AlO). AlOC and AlO have a dielectric constant of seven to eight while ODC has a dielectric constant of three to four.

Similarly, each of the fourth etch stop portion 682a, the fifth etch stop portion 682b, and the sixth etch stop portion 682c is a different material. The fourth etch stop portion 682a includes the nitride of aluminum, the fifth etch stop portion 682b includes the oxygen doped carbon, and the sixth etch stop portion 682c includes aluminum monocarbonyl or an oxide of aluminum. The three layers of etch stop material are used to achieve high yield via openings.

Each of the first etch stop layer 672 and the second etch stop layer 682 has a dielectric constant that is much higher than a normal low-K interlayer dielectric. For example, an average dielectric constant of each of the first etch stop layer 672 and the second etch stop layer 682 is about eight (K ~8), which is much higher than that of a normal low-K interlayer dielectric with a dielectric constant of about two to three (K ~2-3). In some aspects, each of the first etch stop layer 672 and the second etch stop layer 682 includes a high-K material or a combination of materials such as a combination of a high-K material and a low-K material. Examples of material combinations include a combination of carbon-rich silicon oxycarbide (low-K) and AlN (high-K), a combination of an oxide of aluminum (AlO), carbon-rich silicon oxycarbide (SiOC) (low-K) and AlN (high-K), and a combination of AlOC, SiOC(both low-K) and AlN (high-K). Each of the first etch stop layer 672 and the second etch stop layer 682 has a thickness between five to ten nanometers (e.g., eight nanometers (nm)).

FIG. 6 shows the lower level MIM capacitor 680 that uses the three layers of the etch stop (e.g., of the second etch stop layer 682) with a relatively high-K serving as a dielectric for the lower level MIM capacitor 680. The portion of the second etch stop layer 682 used for the dielectric of the lower level MIM capacitor 680 is sandwiched between the capacitor electrodes. The capacitor electrodes include a first electrode that is one of the conductive lines (e.g., the metal line 567) of the conductive interconnect layer 565 as one terminal, and a fabricated second electrode 655 (e.g., titanium nitride (TiN), tantalum nitride (TaN) or tungsten nitride (WN)) as the other terminal. The titanium nitride electrode may be connected to upper layer routing by a via 577 (e.g., a copper (Cu) via). In one aspect, the metal line includes copper (Cu), cobalt (Co), or ruthenium (Ru). Thus, the first electrode may also include copper (Cu), cobalt (Co), or ruthenium (Ru). The lower level MIM capacitor 680 may be connected in parallel or stacked with at least one other capacitor.

Figure 7A:
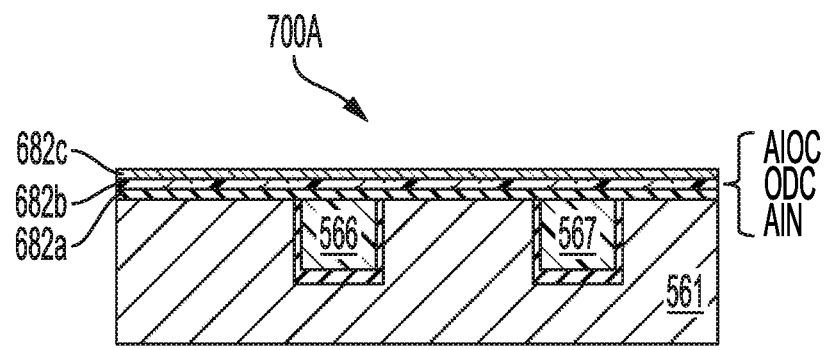
FIGS. 7A, 7B, and 7C are exemplary diagrams illustrating stages of a method of fabricating a lower level metal-insulator-metal (MIM) capacitor, according to an aspect of the present disclosure.
Figure 7B:
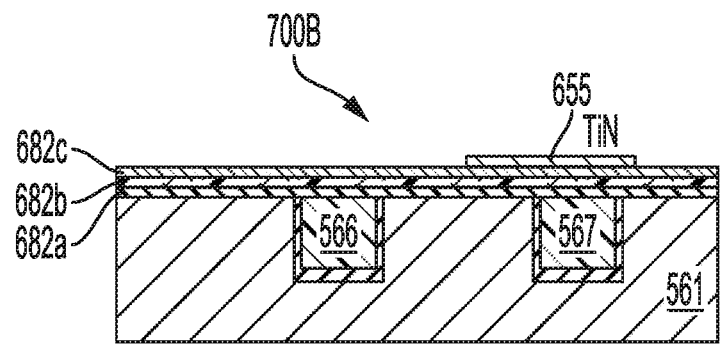
Figure 7C:
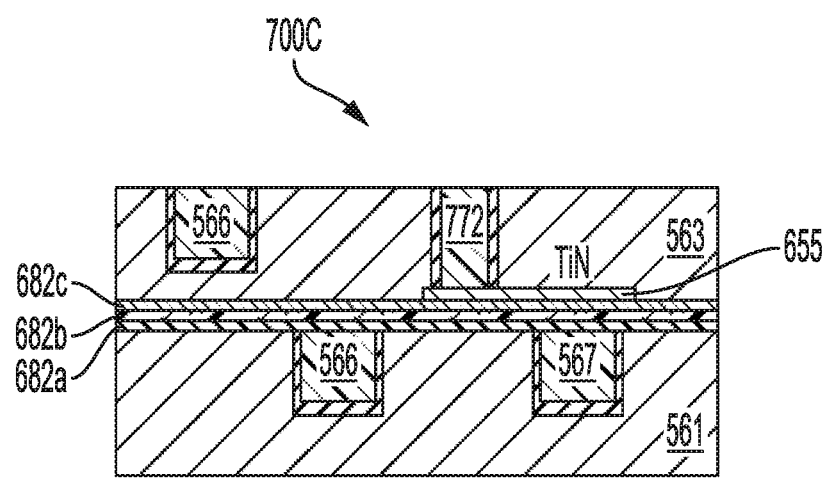

FIGS. 7A, 7B, and 7C are exemplary diagrams illustrating stages of a method of fabricating a lower level MIM capacitor, according to an aspect of the present disclosure. For illustrative purposes, some of the labelling and numbering of the devices and features of FIGS. 7A, 7B, and 7C are similar to those of FIGS. 5 and 6. The process of fabricating the lower level MIM capacitor is altered from conventional BEOL fabrication processes. For descriptive purposes, the exemplary diagrams illustrate processes relevant to the fabrication of the lower level MIM capacitor.

Referring to FIG. 7A, a first stage of the method of fabricating the lower level MIM capacitor is depicted and generally designated 700A. FIG. 7A illustrates a process of forming an interlayer dielectric (e.g., the first interlayer dielectric 561) and an etch stop layer (e.g., the second etch stop layer 682). The etch stop layer can be formed by various thin film deposition techniques such as chemical vapor deposition (CVD), plasma-enhanced chemical vapor deposition (PECVD), physical vapor deposition (PVD) and atomic layer deposition (ALD). The etch stop layer may include a combination of carbon-rich silicon oxycarbide (SiOC) and AlN, a combination of an oxide of aluminum (AlO), SiOC and AlN, or a combination of AlOC, SiOC, and AlN.

Referring to FIG. 7B, a second stage of the method of fabricating the lower level MIM capacitor is depicted and generally designated 700B. FIG. 7B illustrates a process of patterning the second electrode 655. In one aspect of the disclosure, the second electrode 655 may be patterned by lithography or by etching. In this aspect, an extra mask is used to pattern the second electrode 655.

Referring to FIG. 7C, a third stage of the method of fabricating the lower level MIM capacitor is depicted and generally designated 700C. FIG. 7C illustrates patterning of a via 772 that connects the second electrode 655 of the lower level MIM capacitor 680 to other elements of a chip. Selective via etch stops naturally at the second electrode 655.

Figure 8:
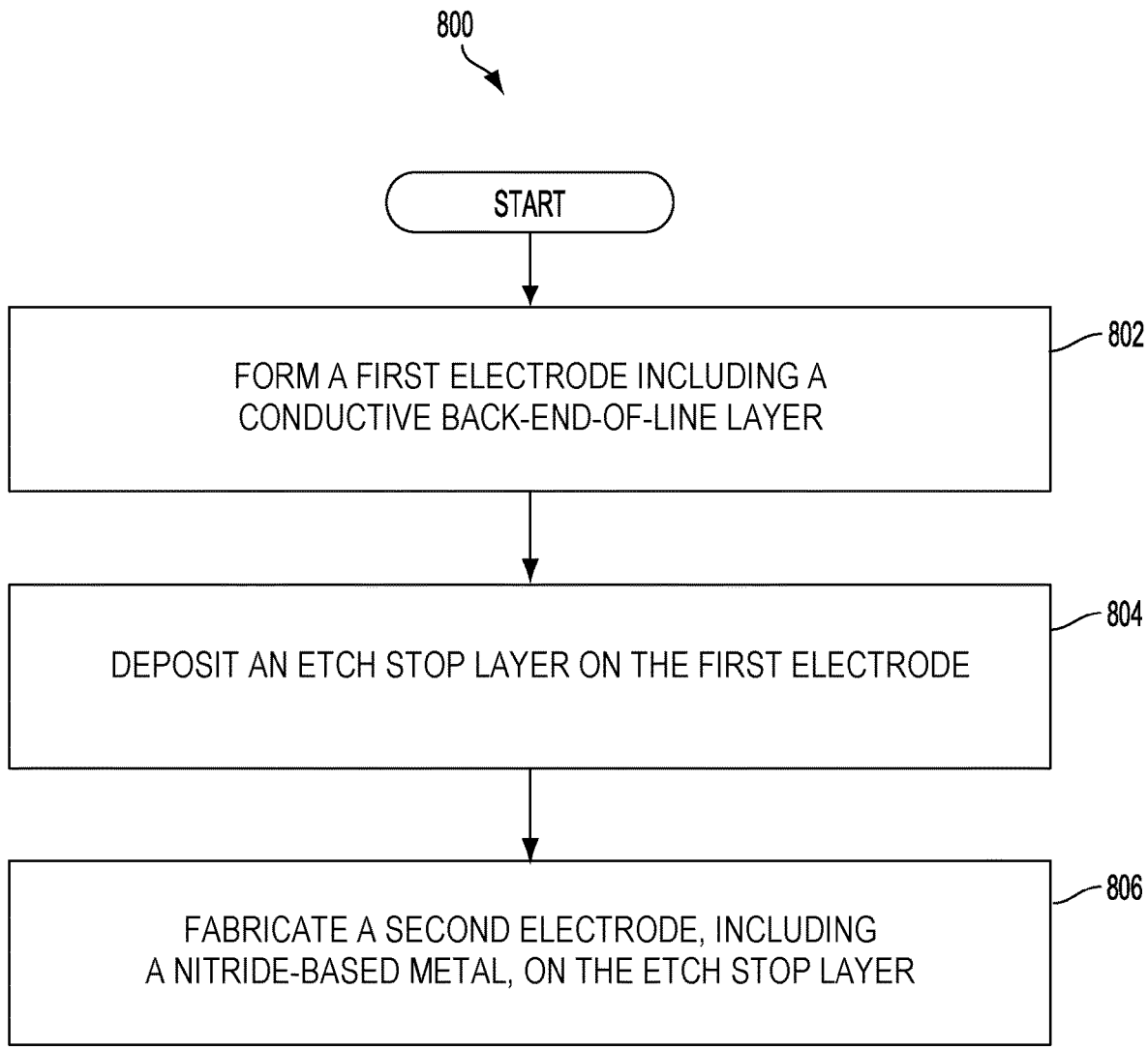
FIG. 8 illustrates a method of fabricating a lower level metal-insulator-metal (MIM) capacitor, according to aspects of the present disclosure.

FIG. 8 illustrates a method 800 of fabricating a lower level MIM capacitor, according to aspects of the present disclosure. The blocks in the method 800 can be performed in or out of the order shown, and in some aspects, can be performed at least in part in parallel. At block 802, a first electrode comprising, a conductive back-end-of-line (BEOL) layer is formed. At block 804, an etch stop layer is deposited on the first electrode. At block 806, a second electrode comprising a nitride-based metal is fabricated on the etch stop layer.

According to a further aspect of the present disclosure, a lower level MIM capacitor is described. The lower level MIM capacitor includes means for interconnecting fabricated devices and wiring interconnects on a substrate. The interconnecting means, for example, include the metal line 567, as shown in FIGS. 5, 6, 7A, 7B and, 7C. In another aspect, the aforementioned means may be any module, or any apparatus configured to perform the functions recited by the aforementioned means.

Figure 9:
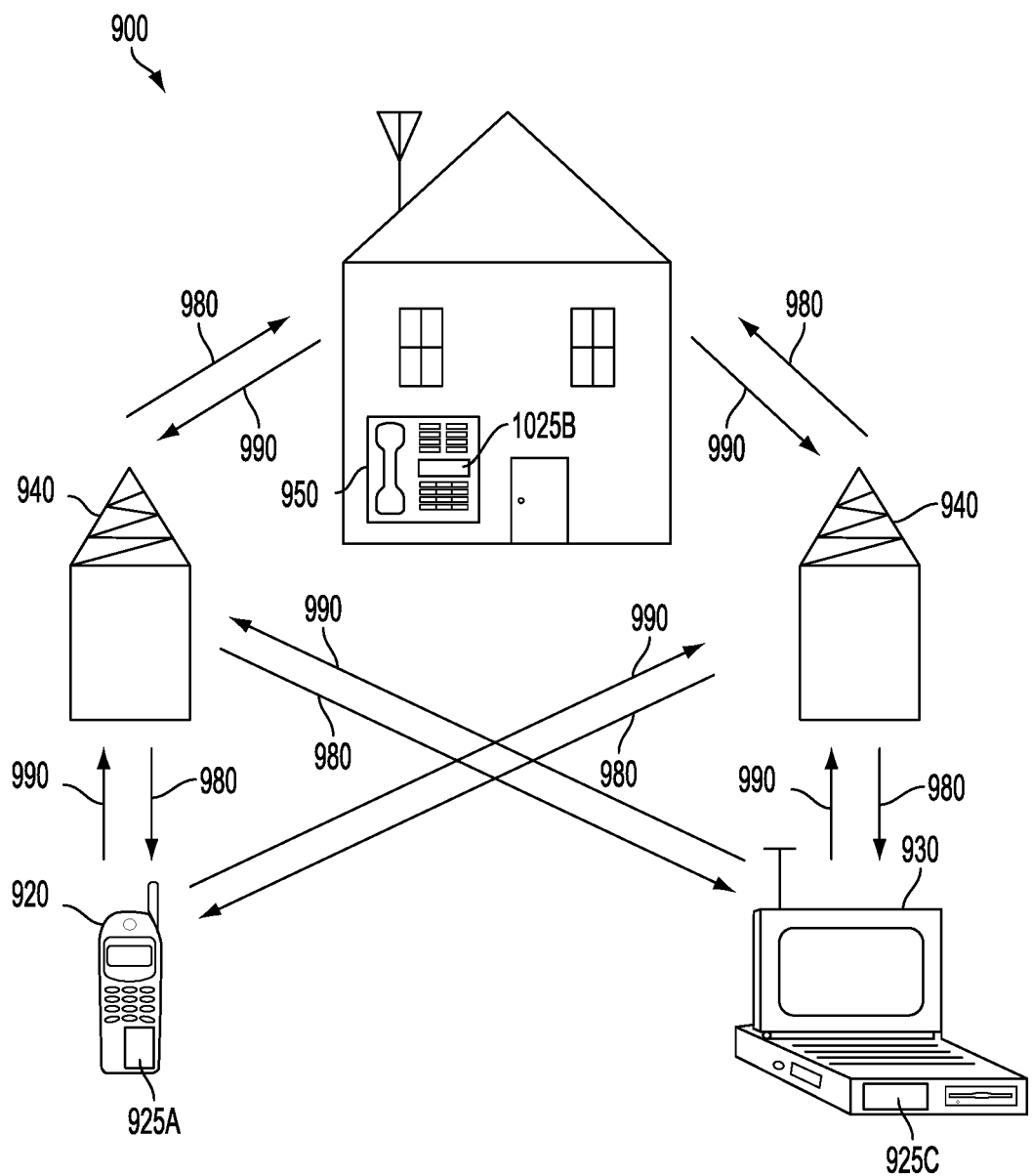
FIG. 9 is a block diagram showing an exemplary wireless communications system in which the lower level metal-insulator-metal (MIM) capacitor may be advantageously employed.

FIG. 9 is a block diagram showing an exemplary wireless communications system 900 in which the lower level MIM capacitor may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include IC devices 925A, 925C, and 925B that include the disclosed lower level MIM capacitor. It will be recognized that other devices may also include the disclosed lower level MIM capacitor, such as the base stations, user equipment, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote units may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed lower level MIM capacitor.

Figure 10:
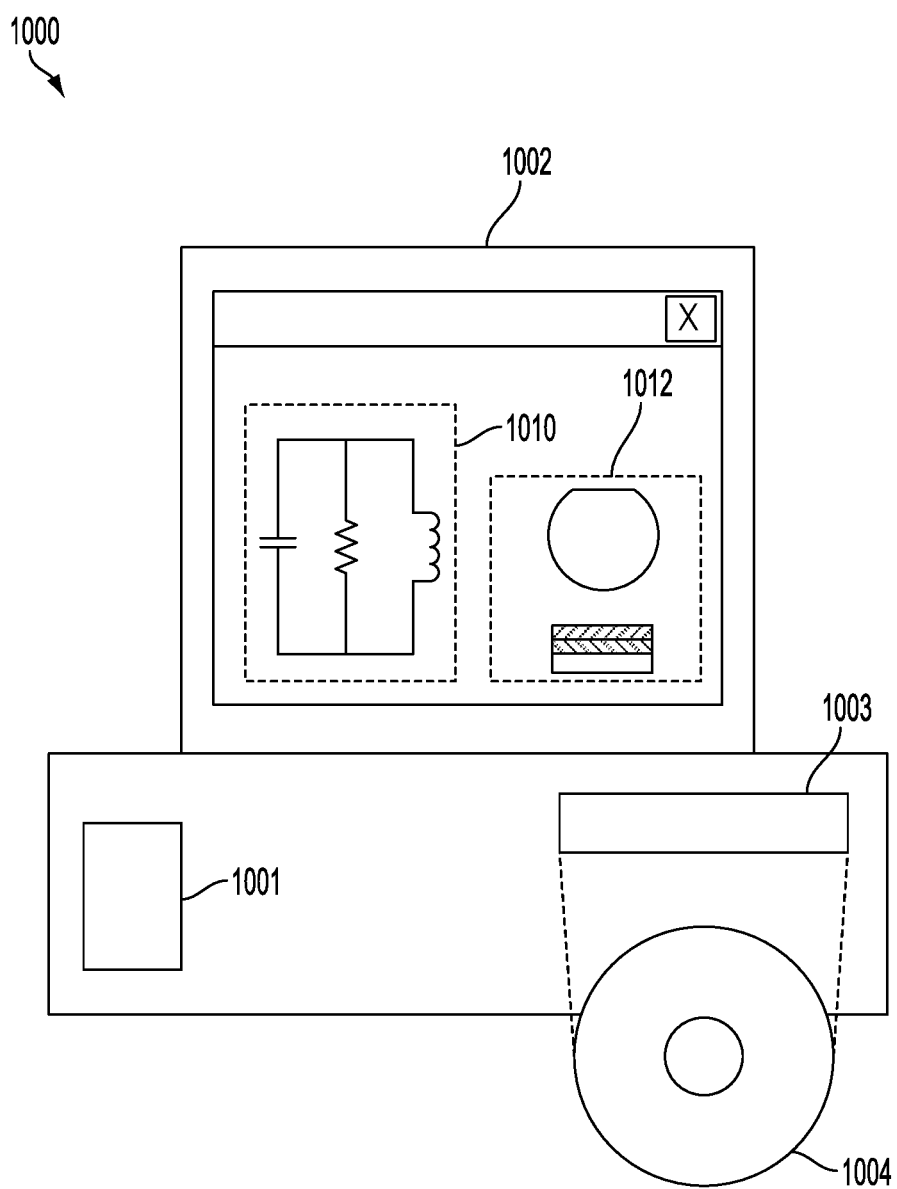
FIG. 10 is a block diagram illustrating a design workstation used for circuit, layout, and logic design of a stacked capacitor disclosed herein.

FIG. 10 is a block diagram illustrating a design workstation used for circuit, layout, and logic design of a lower level MIM capacitor disclosed herein. A design workstation 1000 includes a hard disk 1001 containing operating system software, support files, and design software such as Cadence or OrCAD. The design workstation 1000 also includes a display 1002 to facilitate design of a circuit 1010 or the lower level MIM capacitor. A storage medium 1004 is provided for tangibly storing the design of the circuit 1010 or the lower level MIM capacitor. The design of the circuit 1010 or the lower level MIM capacitor may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the lower level MIM capacitor.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communications networks and/or communications technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. In addition, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to t hose of ordinary skill in the art, including aspects, which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A capacitor, comprising:
    a first electrode comprising a conductive back-end-of-line layer;
    a second electrode comprising a nitride based metal;
    an etch stop layer between the first electrode and the second electrode;
    a conductive plate above the etch stop layer; and
    a dielectric between the conductive plate and the etch stop layer,
    wherein each of the first and the second electrodes includes a via connecting to upper layer routing, and
    wherein the upper layer routing includes corresponding power-supply rails for the first and second electrodes.

2. The capacitor of claim 1, in which the etch stop layer comprises a high-K material or a combination of the high-K material and a low-K material.

3. The capacitor of claim 1, in which the etch stop layer comprises a combination of oxygen doped carbon and aluminum nitride.

4. The capacitor of claim 3, in which the etch stop layer further comprises oxygen doped aluminum.

5. The capacitor of claim 1, in which the etch stop layer is in one layer of a lower four back-end-of-line layers.

6. The capacitor of claim 1, in which the etch stop layer comprises a thickness between five to ten nanometers.

7. The capacitor of claim 1, in which the first electrode comprises copper (Cu), cobalt (Co), or ruthenium (Ru).

8. The capacitor of claim 1, in which the second electrode comprises titanium nitride (TiN), tantalum nitride (TaN) or tungsten nitride (WN).

9. A method of fabricating a capacitor, comprising:
    forming a first electrode comprising a conductive back-end-of-line (BEOL) layer;
    depositing an etch stop layer on the first electrode;
    fabricating a second electrode, including a nitride based metal, on the etch stop layer;
    forming a conductive plate above the etch stop layer;
    forming a dielectric between the conductive plate and the etch stop layer; and forming each of the first and the second electrodes to upper layer routing,
wherein the upper layer routing includes corresponding power-supply rails for the first and second electrodes.

10. The method of claim 9, in which depositing the etch stop layer comprises depositing a high-K material or a combination of the high-K material and a low-K material.

11. The method of claim 9, in which depositing the etch stop layer comprises depositing a combination of oxygen doped carbon and aluminum nitride.

12. The method of claim 9, in which depositing the etch stop layer further comprises depositing oxygen doped aluminum.

13. The method of claim 9, further comprising depositing the etch stop layer in one layer of a lower four back-end-of-line layers.

14. The method of claim 9, in which depositing the etch stop layer comprises depositing the etch stop layer with a thickness between five to ten nanometers.

15. A capacitor, comprising:
means for interconnecting fabricated devices and wiring interconnects on a substrate;
an electrode comprising a nitride based metal;
an etch stop layer between the interconnecting means and the electrode;
a conductive plate above the etch stop layer; and
a dielectric between the conductive plate and the etch stop layer,
wherein the electrode includes a via connecting to upper layer routing, and
wherein the upper layer routing includes a power-supply rail for the electrode.

16. The capacitor of claim 15, in which the etch stop layer comprises a high-K material or a combination of the high-K material and a low-K material.

17. The capacitor of claim 15, in which the etch stop layer comprises a combination of oxygen doped carbon and aluminum nitride.

18. The capacitor of claim 17, in which the etch stop layer further comprises oxygen doped aluminum.

19. The capacitor of claim 15, in which the etch stop layer is in one layer of a lower four back-end-of-line layers.

20. The capacitor of claim 15, in which the etch stop layer comprises a thickness between five to ten nanometers.

* * * * *